United States Patent [19]
Takashina et al.

[11] Patent Number: 5,959,887
[45] Date of Patent: Sep. 28, 1999

[54] ELECTRICALLY ERASABLE PROGRAMMABLE NONVOLATILE SEMICONDUCTOR MEMORY HAVING DUAL OPERATION FUNCTION

[75] Inventors: Nobuaki Takashina; Masanobu Yoshida, both of Kawasaki, Japan

[73] Assignee: Fujitsu Limited, Kanagawa, Japan

[21] Appl. No.: 09/028,768

[22] Filed: Feb. 24, 1998

[30] Foreign Application Priority Data

Jul. 9, 1997 [JP] Japan .................................. 9-183847
Feb. 13, 1998 [JP] Japan .................................. 10-031616

[51] Int. Cl.[6] .............................. G11C 16/04; G11C 7/00
[52] U.S. Cl. ............................. 365/185.13; 365/185.11; 365/189.04
[58] Field of Search ........................ 365/189.04, 230.03, 365/185.05, 185.11, 185.12, 185.13

[56] References Cited

U.S. PATENT DOCUMENTS 5,568,421  10/1996  Aritome ............................ 365/185.17
5,748,528  5/1998  Campardo et al. ................ 365/185.13

FOREIGN PATENT DOCUMENTS 4-188489  7/1992  Japan ............................ G11C 11/401

*Primary Examiner*—Son Mai
*Attorney, Agent, or Firm*—Nikaido Marmelstein Murray & Oram LLP

[57] ABSTRACT

An electrically erasable programmable nonvolatile semiconductor memory has a memory cell array having a plurality of memory cells which are placed as a matrix configuration. The memory cell array is divided into a plurality of memory cell blocks having required sizes by splitting each bit line of the memory cell array at an optional position. This memory provides a dual operation function without complicating the circuit thereof or increasing the chip size thereof. The bit structure of each memory cell block to be divided from the memory cell array is variable.

17 Claims, 8 Drawing Sheets

ELECTRICALLY ERASABLE PROGRAMMABLE NONVOLATILE SEMICONDUCTOR MEMORY HAVING DUAL OPERATION FUNCTION

BACKGROUND OF THE INVENTION

1. Field of the Invention

The present invention relates to an electrically erasable programmable nonvolatile semiconductor memory, and particularly, to an electrically erasable programmable nonvolatile semiconductor memory having a dual operation function.

2. Description of the Related Art

In recent years, among electrically erasable programmable nonvolatile semiconductor memories, flash memories, or FEEPROMs (flash-type electrically erasable programmable read only memories) have been highlighted because they realize large capacity at low cost. The flash memories have a read mode, a write mode, and an erase mode with respect to memory cells contained therein. Each of the modes involves a read operation to read data out of the memory cells.

The erase mode needs a longer time to complete than the read or write mode. To cope with the long time of the erase mode, some flash memories have a dual operation (simultaneous operation) function that divides a memory cell array into two blocks and carries out an erase (erase or write) operation on one of the blocks and a read or write (read) operation on the other. These;e write and erase operations are automatic write and erase operations that are started in response to an external command sequence and are completed within a semiconductor chip.

The dual operation function complicates and enlarges the flash memories. It is impossible to select the bit structure of each block when the memory cell array of the flash memories into blocks.

The details and problems of flash memories of the prior and related arts will be described in detail, later, with reference to the drawings.

SUMMARY OF THE INVENTION

An object of the present invention is to provide an electrically erasable programmable nonvolatile semiconductor memory having a dual operation function, capable of selecting the bit structure of each block when dividing a memory cell array of the memory into blocks, without complicating or enlarging the memory.

According to the present invention, there is provided an electrically erasable programmable nonvolatile semiconductor memory, comprising a memory cell array having a plurality of memory cells placed as a matrix configuration, the memory cell array being divided into a plurality of memory cell blocks having required sizes by splitting each bit line of the memory cell array at an optional position.

The memory cell array may be divided into first and second memory cell blocks by splitting each bit line at a specific position, so that a dual operation may be carried out by the first and second memory cell blocks.

The memory cell array may be divided into the first and second memory cell blocks in a master slicing stage. The memory cell array may be divided into the first and second memory cell blocks by cutting each bit line at a specific position on a semiconductor chip. Each bit line may be cut by fusing the bit line with laser on the semiconductor chip. Each bit line may have a plurality of laser fusing parts at specific positions, and one of the laser fusing parts may be fused with laser.

The memory cell array may be divided into the first and second memory cell blocks by splitting each bit line with using a switching element. Each bit line may have a plurality of switching elements, a specific one of the switching elements being made nonconductive and the others of the switching elements being conductive, to divide the memory cell array into the first and second memory cell blocks. The switching elements may be arranged at predetermined positions on each bit line. The switching elements may be transfer gate transistors. The transfer gate transistors may be controlled by a bit-line dividing decoder.

The first memory cell block may be provided with a first read circuit, and the second memory cell block may be provided with a second read circuit, respectively. The first and second read circuits may be formed on each side of the bit lines. The first and second memory cell blocks may be connected to a common read circuit through select gates which are controlled by a time-division circuit.

An erase operation on the first memory cell block and a read or write operation on the second memory cell block may be carried out simultaneously. An erase or write operation on the first memory cell block and a read operation on the second memory cell block may be carried out simultaneously. The electrically erasable programmable nonvolatile semiconductor memory may be a flash-type electrically erasable programmable read only memory.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments of the present invention, the problems of the prior and related arts will be explained with reference to the drawings.

A flash memory (FEEPROM) has a read mode, a write mode, and an erase mode with respect to memory cells incorporated in the memory. Each of the modes involves a read operation to read data out of the memory cells. Namely, the read mode naturally involves the read operation, and the write and erase modes need the read operation for verification to see if the memory cells have been set to a required level.

Figure 1:
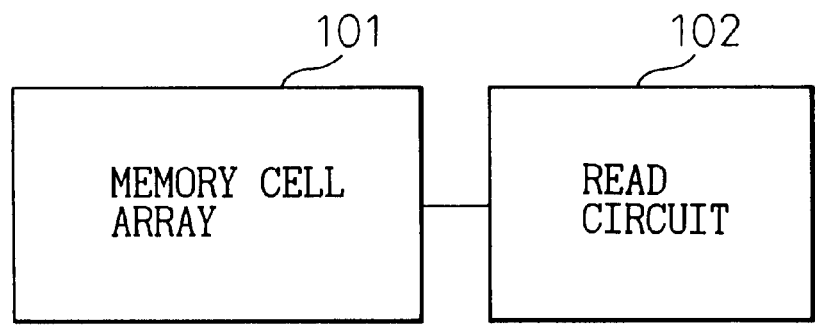
FIG. 1 is a block diagram showing a nonvolatile semiconductor memory having a memory cell array and a read circuit according to a prior art.

FIG. 1 is a block diagram showing a flash memory having a memory cell array 101 and a read circuit 102, according to a prior art.

This prior art tries to improve chip area efficacy by providing a memory cell array with a single read circuit. The read circuit 102 carries out a read operation in the read mode and a verifying read operation in the write and erase modes.

The erase mode needs a long time, for example several seconds, to complete. This is several tens to several hundreds of times longer than a time to complete the read or write mode. To cope with the long erase time, the prior art divides the memory cell array 101 into sectors and executes the erase mode on one of the sectors. This, however, greatly deteriorates the efficacy of a system that employs the flash memory because the memory cell array 101 has only one read circuit 102 that is shared by the read, write, and erase modes, and therefore, it is impossible to erase a specific sector while reading or writing the others.

To solve this problem, it has been proposed to provide the flash memory with a dual operation (simultaneous operation) function.

Figure 2:
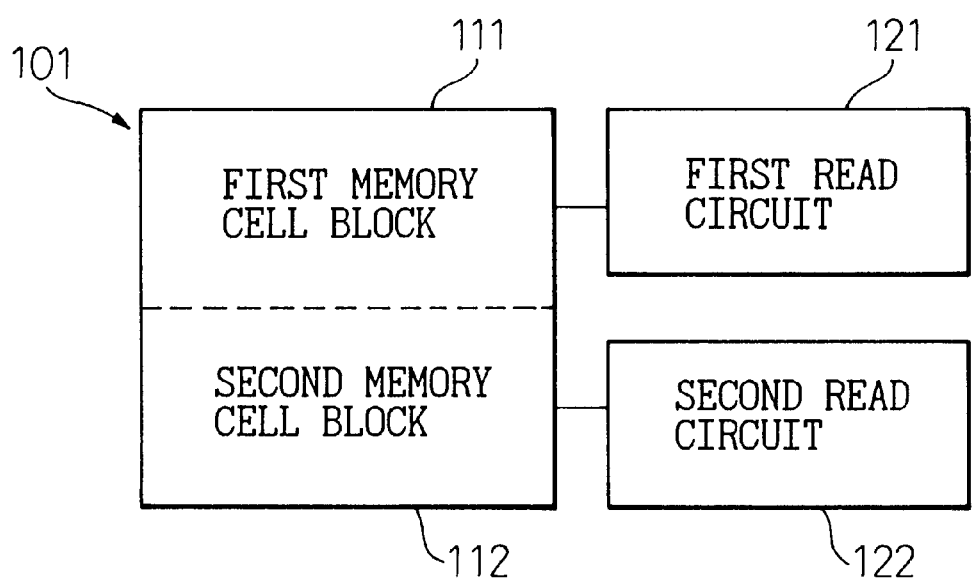
FIG. 2 is a block diagram showing a nonvolatile semiconductor memory having a memory cell array and read circuits according to a related art.

FIG. 2 is a block diagram showing a flash memory with a dual operation function according to a related art. The flash memory has a memory cell array 101 that is divided into first and second memory cell blocks 111 and 112. The blocks 111 and 112 are provided with first and second read circuits 121 and 122, respectively.

Providing a flash memory with the dual operation function may simply be realized by forming the flash memory with two chips (semiconductor chips). To reduce the area of the flash memory, parts thereof must be shared and integrated into one chip. The related art of FIG. 2 divides the memory cell array 101 into the blocks 111 and 112 and connects them to the read circuits 121 and 122, respectively.

The dual operation function carries out an erase (erase or write) operation on one of the blocks 111 and 112, and at the same time, a read or write (read) operation on the other. These write and erase operations are automatic write and erase operations that are started in response to an external command sequence and are completed within the chip.

Figure 3:
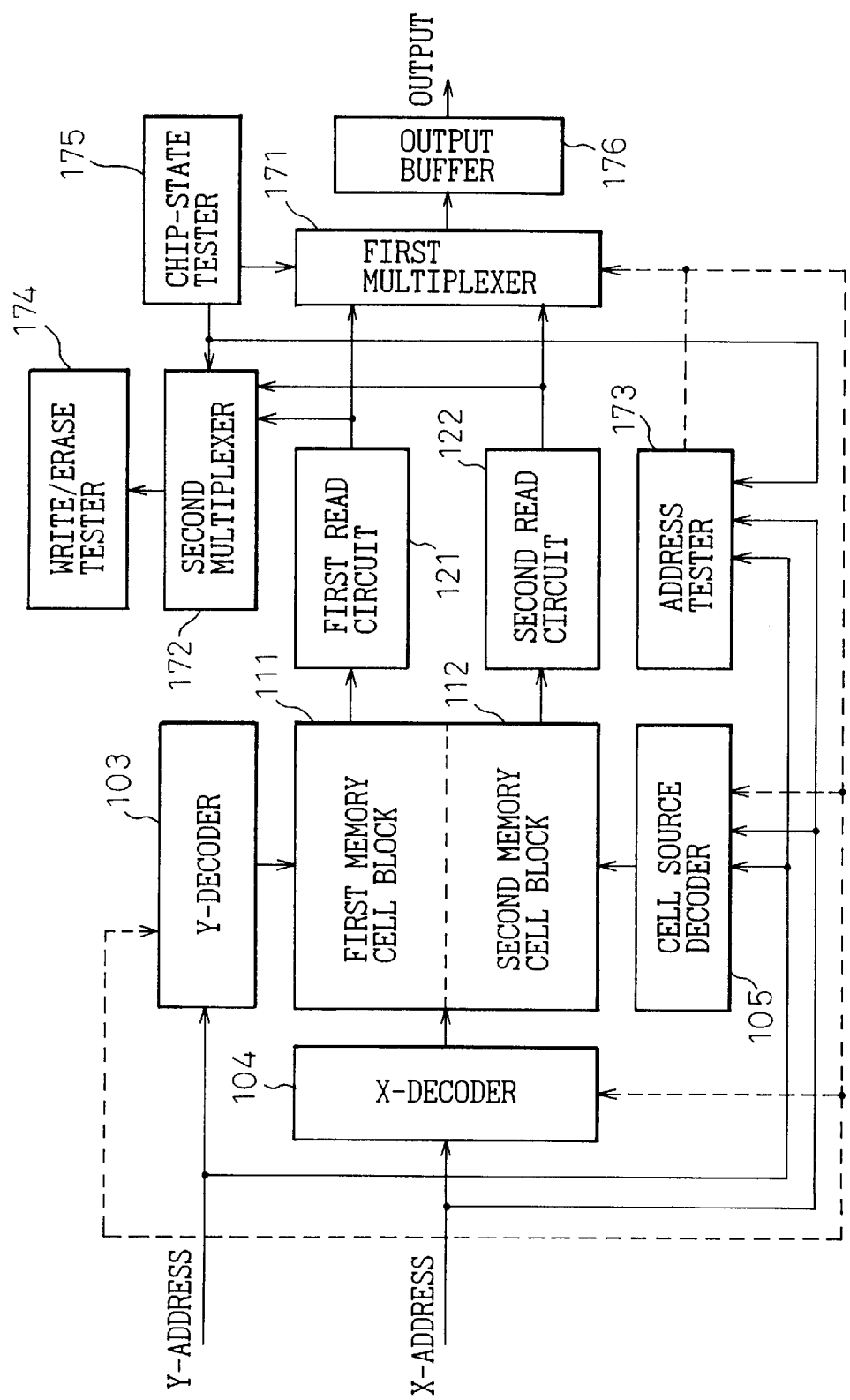
FIG. 3 is a block diagram showing the details of the memory of FIG. 2.
Figure 4:
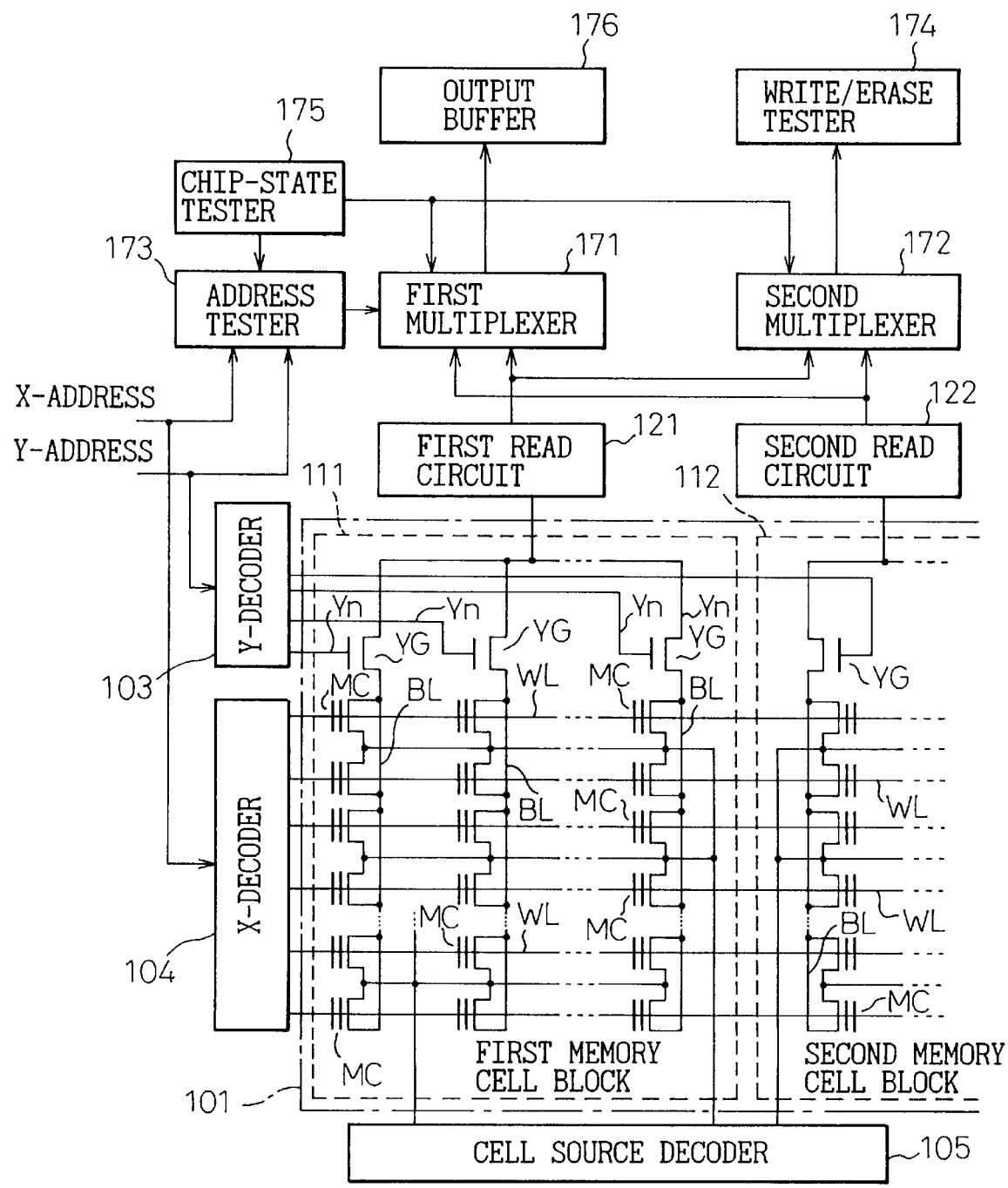
FIG. 4 is a block diagram showing the details of the memory of FIG. 3.

FIG. 3 is a block diagram showing the details of the flash memory of FIG. 2 and external and basic signals to and from the memory. FIG. 4 shows the further details of FIG. 3.

Shown in FIGS. 3 and 4 are a Y-decoder (a column decoder) 103, an X-decoder (a row decoder) 104, a cell source decoder 105, first and second multiplexers 171 and 172, an address tester 173, a write/erase tester 174, a chip-state tester 175, and an output buffer 176. Shown in FIG. 4 are Y-select gates (bit-line select gates) YG, bit lines BL, word lines WL, and memory cells MC. In practice, the flash memory involves other circuits such as one that controls a source voltage to the memory cells MC in response to the output of the write/erase tester 174. These are omitted in FIGS. 3 and 4 for the sake of simplicity.

The memory cells MC are arranged in a matrix at the intersections of the bit lines BL and word lines WI. The Y-decoder 103 selects bit lines BL through select lines Yn and the Y-select gates YG, and the X-decoder 1041 selects a word line WL. The memory cells MC at the intersections of these selected bit and word lines are accessed. The cell source decoder 105 is connected to the source electrodes of the memory cells MC to collectively, or sector by sector, erase the memory cells MC.

The memory cell array 101 is divided into the blocks 111 and 112 at a predetermined position on each word line WL. The blocks 111 and 112 are connected to the exclusive-use read circuits 121 and 122, respectively. The block 111 contains a predetermined number of bit lines BL and is connected to the read circuit 121. The block 112 contains the remaining bit lines and is connected to the read circuit 122. The dual operation function of this flash memory carries out an erase (erase or write) operation on one of the blocks 111 and 112, and at the same time, a read or write (read) operation on the other.

In this way, the bit lines of the block 111 are connected to the read circuit 121, and the bit lines of the block 112 are connected to the read circuit 122. The bit lines may be separated into groups that are connected to read circuits, respectively.

To provide the dual operation function, the flash memory of FIGS. 3 and 4 additionally has, compared with a non-dual-operation flash memory, the address tester 173 and the multiplexers 171 and 172 connected to the read circuits 121 and 122. As explained above, the dual operation starts in response to an external command sequence and automatically carries out a write or erase operation on one of the blocks 111 and 112, and at the same time, a read operation on the other. All other operations are prohibited.

More precisely, if an erase or write operation is being carried out on the block 111, only a read operation is allowed on the block 112. Controlling the memory cell array 101 will be explained.

An erase (or write) operation on the block 111 is controlled by, in addition to usual flash memory elements, the chip-state tester 175 and second multiplexer 172. To erase the block 111, the chip-state tester 175 instructs the multiplexer 172 to select the output of the read circuit 121 and send the selected one to the write/erase tester 174. A read operation on the block 112 is controlled by, in addition to the usual flash memory elements, the chip-state tester 175 and address tester 173. The address tester 173 refers to the output of the chip-state tester 175 and input X- and Y-addresses, determines whether or not the addresses are of the block 112 to read, and sends a resultant signal to the first multiplexer 171.

The first multiplexer 171 refers to the outputs of the chip-state tester 175 and address tester 173, selects the output of the read circuit 122 connected to the block 112 to read, and sends the selected one to the output buffer 176. An erase (or write) operation on the block 112 is carried out in the same manner except that the multiplexers 171 and 172 select the opposite read circuits from the above explanation.

To provide the dual operation function mentioned above, the flash memory of the related art must have the address tester 173 and the multiplexers 171 and 172 connected to the read circuits 121 and 122. In practice, there is an occasion in which the outputs of the X- and Y-decoders 104 and 103 and cell source decoder 105 must be changed with respect to input X- and Y-addresses, depending on the output of the address tester 173. Accordingly, these components must receive the output of the address tester 173. The details of this are omitted for the sake of simplicity.

To manufacture the flash memory of this related art, bit lines to be connected to the read circuits 121 and 122 must be defined during a designing stage. It is difficult, therefore, to change the bit structure of each block of the memory cell array of the flash memory when using it for a computer system. To change the bit structure of each block of the memory cell array of the flash memory, a separate coding circuit is needed to complicate the flash memory.

Figure 5:
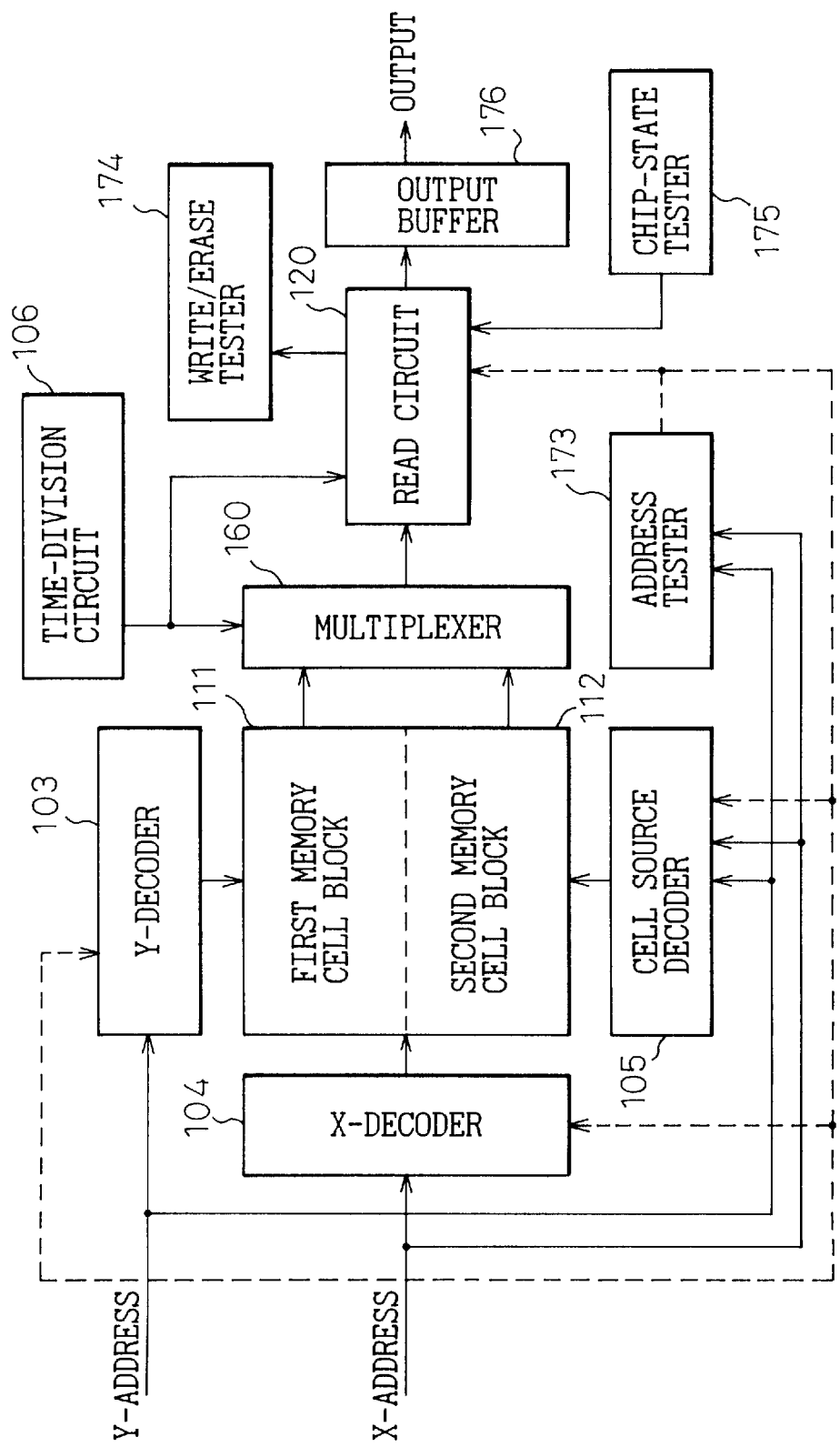
FIG. 5 is a block diagram showing a nonvolatile semiconductor memory according to a modification of the related art of FIG. 3.
Figure 6:
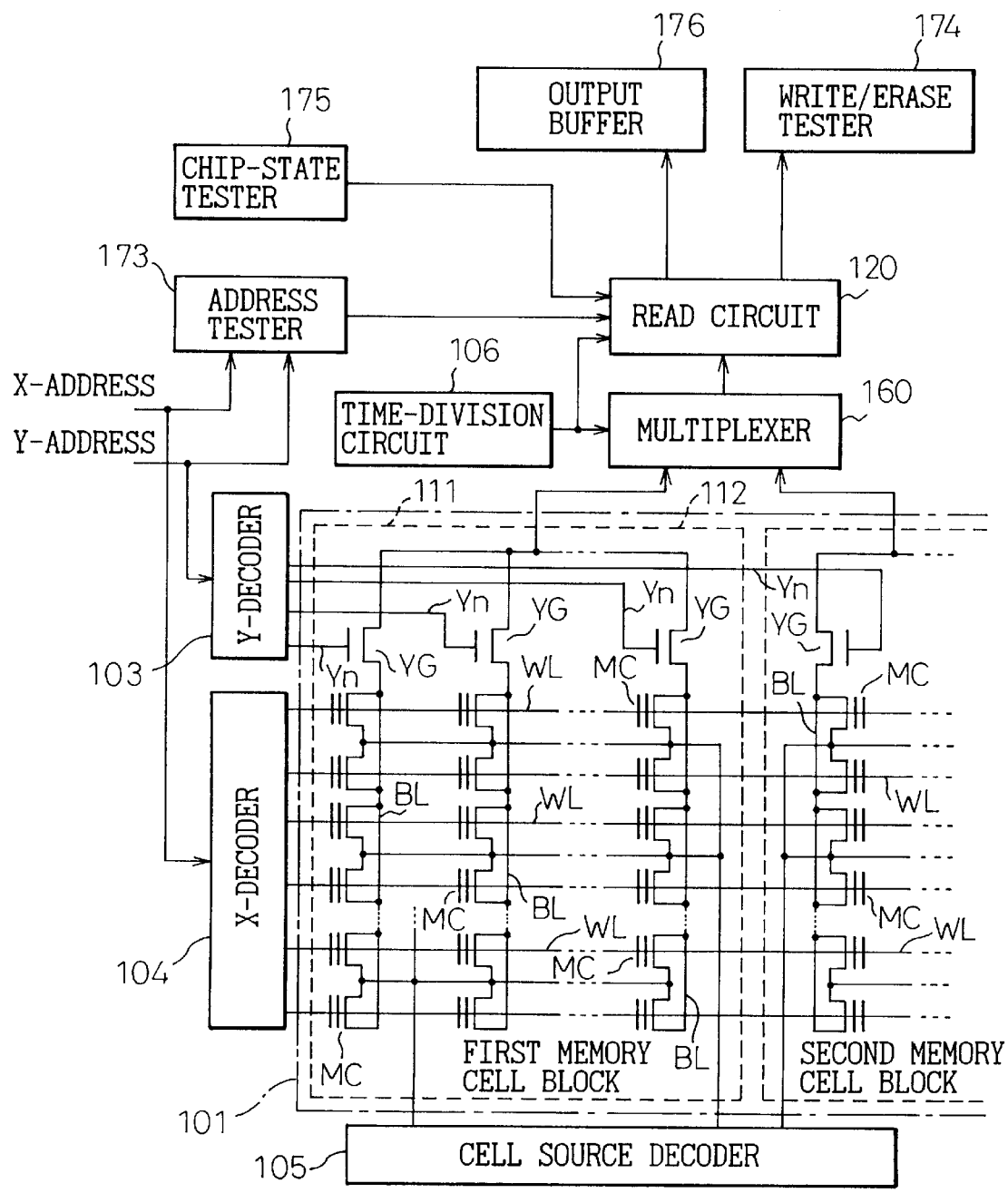
FIG. 6 is a block diagram showing the details of the memory of FIG. 5.

FIG. 5 is a block diagram showing a flash memory according to a modification of the related art of FIG. 3, and FIG. 6 is a block diagram showing the details of FIG. 5. The flash memory of FIGS. 5 and 6 is characterized by a time-division circuit 106, a read circuit 120, and a multiplexer 160.

The multiplexer 160 covers a memory cell array 101. The read circuit 120 is an integration of the read circuits 121 and 122 of FIGS. 3 and 4.

The memory cell array 101 is divided into first and second memory cell blocks 111 and 112, which are connected to the common read circuit 120 through the multiplexer 160. The time-division circuit 106 instructs the multiplexer 160 to alternately select the blocks 111 and 112 at regular intervals, and at the same time, informs the read circuit 120 which of the blocks 111 and 112 is selected by the multiplexer 160. While an erase (erase or write) operation is being carried out on one of the blocks 111 and 112, the read circuit 120 is alternately connected to the blocks 111 and 112 in a time-division manner, to simultaneously carry out a read or write (read) operation on the other block.

According to the outputs of the time-division circuit 106, a chip-state tester 175, and an address tester 173, the read circuit 120 sends an output signal to an output buffer 176 or to a write/erase tester 174. The operation of the address tester 173 is the same as that of FIGS. 3 and 4 except that the address tester 173 controls the read circuit 120.

To manufacture the flash memory of the related art of FIGS. 5 and 6, the structure of bit lines connected to the read circuit 120 through the multiplexer 160 must be defined during a designing stage. It is difficult, therefore, to change the bit structure of each block of the memory cell array of the flash memory thereafter.

The flash memory of any one of the related arts of FIGS. 3 to 6 has a capacity of, for example, eight megabits with two megabits in the block 111 and six megabits in the block 112. If the user of the flash memory, who may fabricate a computer system with the flash memory, wants to frequently erase one-megabit data such as one-megabit computer BIOS data, the user may allocate the one-megabit data to the block 111 having a smaller capacity of two megabits. In this case, the remaining one megabit in the block 111 is unaccessible for a read or write operation while the block 111 is being erased, unlike the block 112 that is accessible even if the block 111 is being erased. Namely, the one-megabit free space in the block 111 is useless. To change the bit structure of each block of the memory cell array of the flash memory, the flash memory must have a separate intricate coding circuit to increase the cost of the flash memory.

Next, preferred embodiments of the present invention will be explained.

Figure 7:
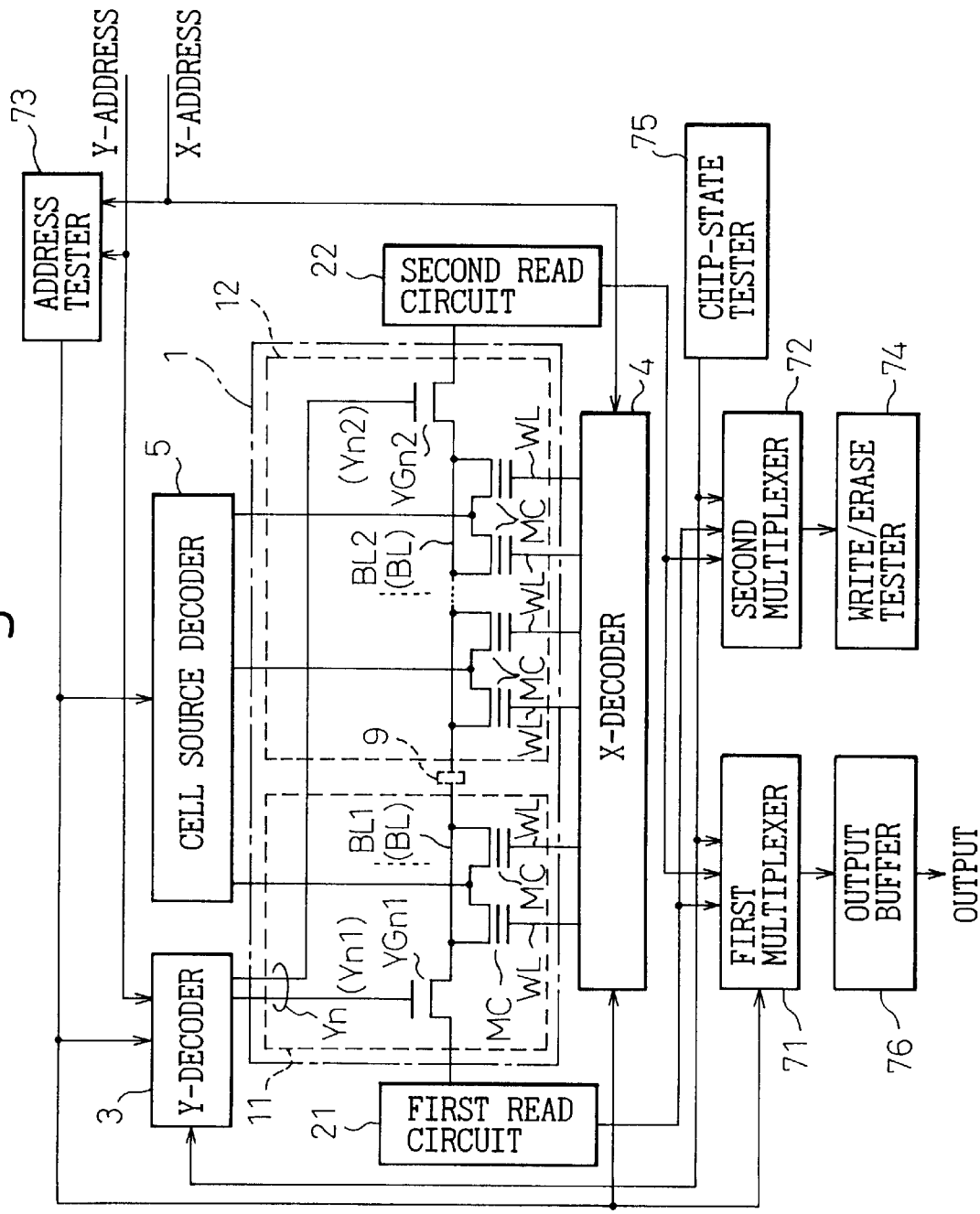
FIG. 7 is a block diagram showing a nonvolatile semiconductor memory according to a first embodiment of the present invention.

FIG. 7 is a block diagram showing a nonvolatile semiconductor memory (a flash memory: FEEPROM) according to the first embodiment of the present invention. This embodiment corresponds to the related art of FIGS. 3 and 4. The flash memory has a memory cell array 1 divided into first and second memory cell blocks 11 and 12. The flash memory involves first and second read circuits 21 and 22, a Y-decoder (a column decoder) 3, an X-decoder (a row decoder) 4, a cell source decoder 5, a laser fusing part 9 arranged on each bit line BL, first and second multiplexers 71 and 72, an address tester 73, a write/erase tester 74, a chip-state tester 75, and an output buffer 76. The block 11 has word lines WL and bit lines BL1 each having a Y-select gate (a bit line select gate) YGn1. The block 12 has word lines WL and bit lines BL2 each having a Y-select gate (a bit line select gate) YGn2. Memory cells MC are formed at the intersections of the word and bit lines.

In practice, the flash memory involves other circuits such as one that controls a source voltage to the memory cells MC in response to the output of the write/erase tester 74. These are omitted in FIG. 7 for the sake of simplicity. Although FIG. 7 shows only one bit line BL divided into bit lines BL1 and BL2, the flash memory actually has other bit lines each divided into bit lines BL1 and BL2.

The bit line BL is fused at the laser fusing part 9 and is electrically separated into the first and second bit lines BL1 and BL2. The other bit lines are also fused at the same position so that the bit lines BL1 are in the block 11 and the bit lines BL2 in the block 12. Each bit line BL1 in the block 11 is connected to the read circuit 21 beside the block 11. Each bit line BL2 in the block 12 is connected to the read circuit 22 beside the block 12. The position of the laser fusing part 9 on each bit line BL is optional and may be dependent on a user's request. Several laser fusing parts 9 may be arranged on each bit line BL so that a requested one of them is fused.

Similar to the related art, the first embodiment provides the dual operation (simultaneous operation) function that automatically carries out a write or erase operation on one of the blocks 11 and 12 in response to an external command sequence, and at the same time, a read operation on the other block. The dual operation function prohibits any other operations. The details of the dual operation on the blocks 11 and 12 are basically the same as those of the related art of FIGS. 3 and 4.

When each bit line BL is fused at the laser fusing part 9, an address testing logic changes accordingly. The address tester 73 receives X- and Y-addresses, and the output of the address tester 73 is supplied to the X-decoder 4, Y-decoder 3, cell source decoder 5, and first multiplexer 71. The output of the chip-state tester 75 is supplied to the multiplexers 71 and 72 and Y-decoder 3.

With respect to the same Y-address Yn, the Y-decoder 3 provides two outputs Yn1 and Yn2, which control the Y-select gates (bit-line select gates) YGn1 and YGn2 for the bit lines BL1 and BL2. The Y-select gates YGn1 and YGn2 are variously switched on and off in response to a combination of the outputs of the address tester 73 and chip-state tester 75.

The flash memory of the first embodiment is simpler than that of the related art of FIGS. 3 and 4 in a source decoding system. The related art divides the memory cell array 101 into the blocks 111 and 112 along the bit lines BL across the word lines WL. Accordingly, a line for gathering the sources of the memory cells MC along the word lines must be cut at the boundary between the blocks 111 and 112. On the other hand, the first embodiment divides the memory cell array 1 into the blocks 11 and 12 along the word lines WL across the bit lines BL, and therefore, a line for gathering the sources of the memory cells along the word lines is not cut at the boundary between the blocks 11 and 12. Eventually, the embodiment simplifies the source decoding system compared with the related art.

Instead of fusing the laser fusing part 9 on each bit line, the embodiment may cut each bit line on a chip at a predetermined position into bit lines BL1 and BL2 during a master slicing stage, to thereby divide the memory cell array 1 into the blocks 11 and 12.

Dividing a memory cell array into blocks during the master slicing stage is able to provide, according to a user's request, any bit structure in flash memories, having the same basic design.

The Y-decoder 3 selectively connects the bit lines BL1 and BL2 to the read circuits 21 and 22 through the Y-select gates YGn1 and YGn2. The memory cells MC are arranged in a matrix at the intersections of the bit lines and word lines. The Y-decoder 3 selects some bit lines through the select lines Yn and Y-select gates YGn1 and YGn2, and the X-decoder 4 selects a word line WL. Then, the memory cells at the intersections of the selected bit and word lines are accessed. The cell source decoder 5 is connected to the source electrodes of the memory cells MC, to erase the memory cells collectively or sector by sector.

In this way, the flash memory of the first embodiment involves no complicated circuits nor enlargement in size to change the bit structure of each memory cell block in the flash memory. The flash memory provides the dual operation function that carries out an erase (erase or write) operation on one of the blocks, and at the same time, a read or write (read) operation on the other block.

Figure 8:
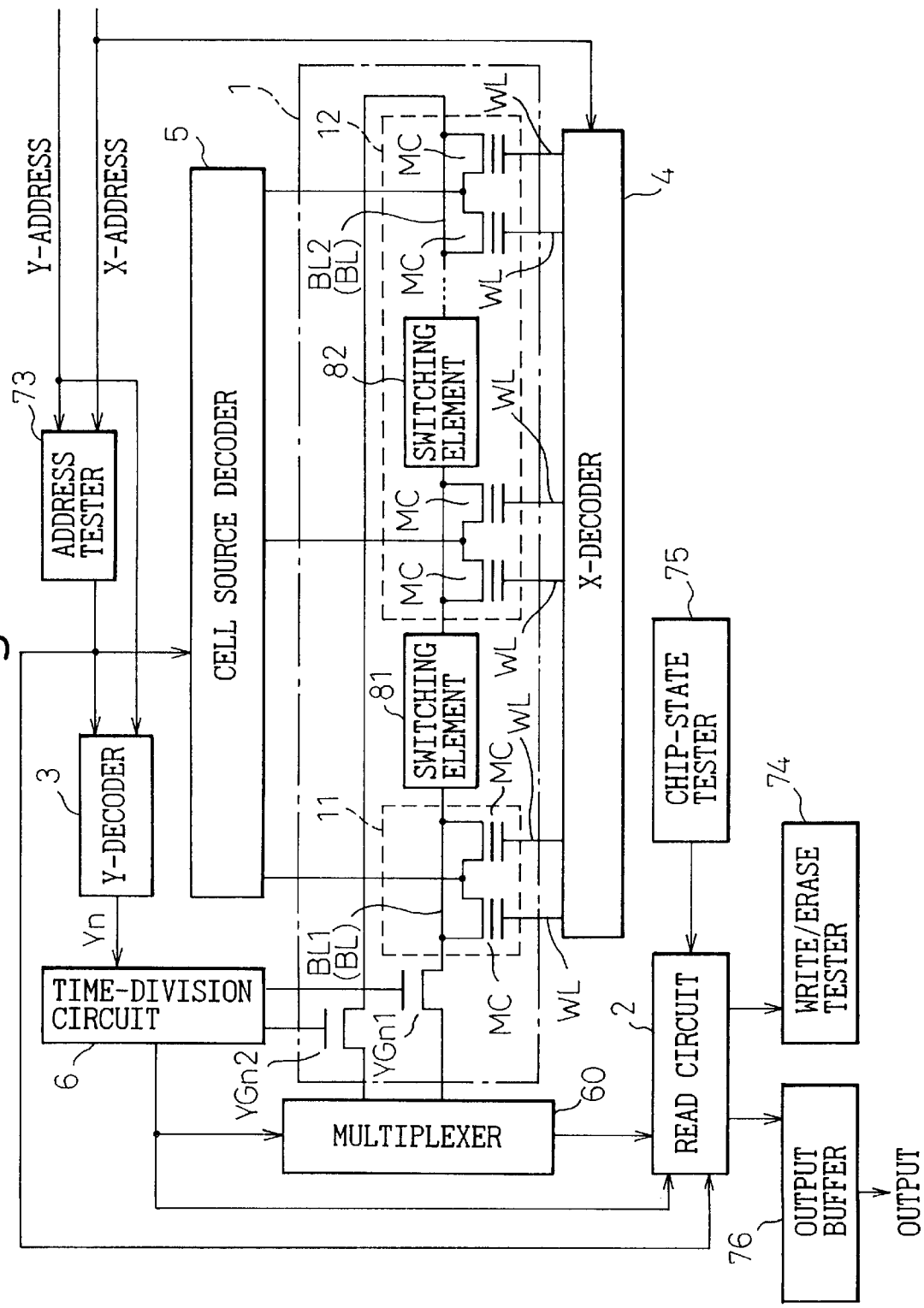
FIG. 8 is a block diagram showing a nonvolatile semiconductor memory according to a second embodiment of the present invention.

FIG. 8 is a block diagram showing a nonvolatile semiconductor memory (a flash memory) according to the second embodiment of the present invention. This embodiment corresponds to the related art of FIGS. 5 and 6. The flash memory of the second embodiment involves a read circuit 2, a time-division circuit 6, and switching elements 81, 82, etc. Although FIG. 8 shows only one bit line BL divided into bit lines BL1 and BL2, the flash memory actually has a plurality of bit lines each divided into bit lines BL1 and BL2, to divide a memory cell array 1 into first and second memory cell blocks 11 and 12. This flash memory provides the dual operation function that starts in response to an external command sequence and automatically carries out a write or erase operation on one of the blocks 11 and 12, and at the same time, a read operation on the other block. The dual operation function prohibits all other operations.

The second embodiment is characterized by arranging the switching elements 81, 82, etc., at predetermined positions on each bit line BL. An optional one (81 in FIG. 8) of the switching elements is made nonconductive, and the others are made conductive, to divide the bit line into bit lines BL1 and BL2.

The bit lines BL1 and BL2 are connected to the common read circuit 2 through a multiplexer 60 whose switching is controlled by the time-division circuit 6. Select gates YGn1 and YGn2 are controlled by the time-division circuit 6. While an erase (erase or write) operation is being carried out on, for example, the bit lines BL1 of the block 11, the read circuit 2 is alternately connected to the blocks 11 and 12 in a time division manner, so that a read or write (read) operation is simultaneously carried out on the bit lines BL2 of the block 12.

Making an optional one of the switching elements nonconductive and the others conductive is achievable during, for example, a master slicing stage.

Figure 9:
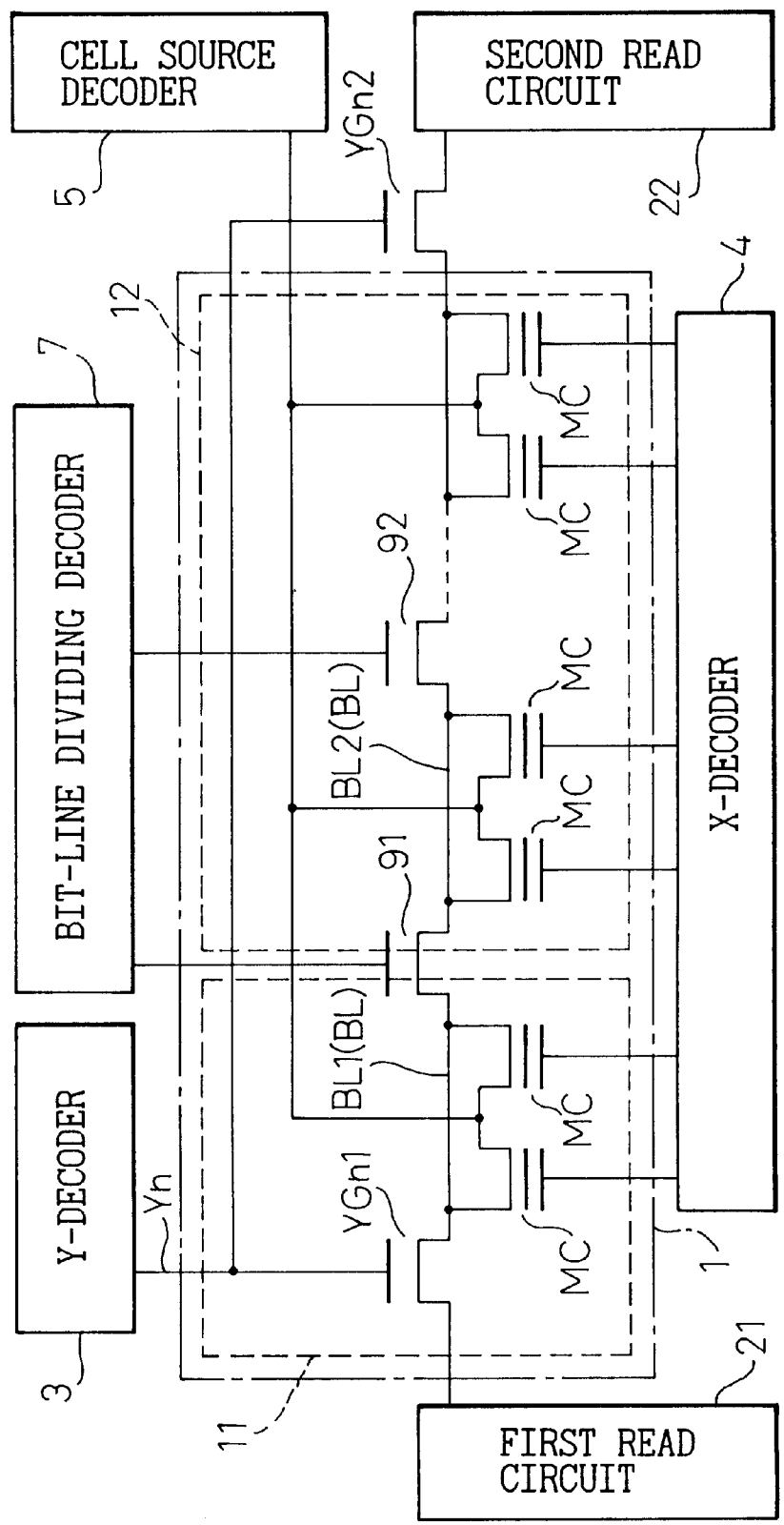
FIG. 9 is a block diagram showing a nonvolatile semiconductor memory according to a third embodiment of the present invention.

FIG. 9 is a block diagram showing a nonvolatile semiconductor memory (a flash memory) according to the third embodiment of the present invention. This embodiment employs a bit-line dividing decoder 7 and transfer gate transistors 91, 92, etc. FIG. 9 omits other elements such as first and second multiplexers (71, 72), an address tester (73), a write/erase tester (74), a chip-state tester (75), and an output buffer (76) provided for the first and this embodiments.

The third embodiment arranges the transfer gate transistors 91, 92, etc., at predetermined positions on each bit line BL. Similar to the switching elements of the second embodiment, an optional one of the transfer gate transistors is made nonconductive and the others conductive. These transfer gate transistors are controlled by the bit-line dividing decoder 7. Information about the conduction of the transfer gate transistors may be stored in a nonvolatile memory element so that a user may select the bit structures of block 11 and 12 of a memory cell array 1. Instead of the nonvolatile memory element, signals may be supplied to the bit-line dividing decoder 7, to control the conduction of the transfer gate transistors 91, 92, etc. The number of the transfer gate transistors on each bit line must be a required minimum to maintain a sharp level change in the bit line. In addition, these transfer gate transistors must have small internal resistance and capacitance.

The laser fusing parts 9, switching elements 81, 82, . . . , and transfer gate transistors 91, 92, . . . of the first to third embodiments are arranged at predetermined positions on each bit line, to cut the bit line. For example, they are arranged for an 8-megabit flash memory at intervals of one megabit so that the flash memory may be divided into blocks having required bit structures. Although the above explanation relates to flash memories, the present invention is not limited to the flash memories but is applicable to any type of nonvolatile semiconductor memory.

As explained above, the present invention provides dual-operation nonvolatile semiconductor memories that are compact and capable of electrically dividing bit lines at an optional position, to form memory cell blocks that are simultaneously individually accessible.

Many different embodiments of the present invention may be constructed without departing from the spirit and scope of the present invention, and it should be understood that the present invention is not limited to the specific embodiments described in this specification, except as defined in the appended claims.

What is claimed is:

1. An electrically erasable programmable nonvolatile semiconductor memory, capable of executing an erase operation, a read operation and a write operation, comprising:

a memory cell array having a plurality of memory cells arranged in a matrix, said memory cell array being divided into first and second memory cell blocks by splitting each bit line of said memory cell array at an optional position, wherein one type of operation among the erase, read and write operations in the first memory cell block is executed simultaneously with another type of operation in the second memory cell block.

2. An electrically erasable programmable nonvolatile semiconductor memory as claimed in claim 1, wherein said memory cell array is divided into said first and second memory cell blocks in a master slicing stage.

3. An electrically erasable programmable nonvolatile semiconductor memory as claimed in claim 1, wherein said memory cell array is divided into said first and second memory cell blocks by cutting each bit line at a specific position on a semiconductor chip.

4. An electrically erasable programmable nonvolatile semiconductor memory as claimed in claim 3, wherein each bit line is cut by fusing said bit line, with a laser, on said semiconductor chip.

5. An electrically erasable programmable nonvolatile semiconductor memory as claimed in claim 4, wherein each bit line has a plurality of laser fusing parts at specific positions, and one of said laser fusing parts is fused with laser.

6. An electrically erasable programmable nonvolatile semiconductor memory as claimed in claim 1, wherein said memory cell array is divided into said first and second memory cell blocks by splitting each bit line with using a switching element.

7. An electrically erasable programmable nonvolatile semiconductor memory as claimed in claim 6, wherein each bit line has a plurality of switching elements, a specific one of said switching elements being made nonconductive and the others of said switching elements being conductive, to divide said memory cell array into said first and second memory cell blocks.

8. An electrically erasable programmable nonvolatile semiconductor memory as claimed in claim 7, wherein said switching elements are arranged at predetermined positions on each bit line.

9. An electrically erasable programmable nonvolatile semiconductor memory as claimed in claim 7, wherein said switching elements are transfer gate transistors.

10. An electrically erasable programmable nonvolatile semiconductor memory as claimed in claim 9, wherein said transfer gate transistors are controlled by a bit-line dividing decoder.

11. An electrically erasable programmable nonvolatile semiconductor memory as claimed in claim 1, wherein said first memory cell block is provided with a first read circuit, and said second memory cell block is provided with a second read circuit, respectively.

12. An electrically erasable programmable nonvolatile semiconductor memory as claimed in claim 11, wherein said first and second read circuits are formed on each side of said bit lines.

13. An electrically erasable programmable nonvolatile semiconductor memory as claimed in claim 1, wherein said first and second memory cell blocks are connected to a common read circuit through select gates which are controlled by a time-division circuit.

14. An electrically erasable programmable nonvolatile semiconductor memory as claimed in claim 1, wherein an erase operation on said first memory cell block and a read or write operation on said second memory cell block are simultaneously carried out.

15. An electrically erasable programmable nonvolatile semiconductor memory as claimed in claim 1, wherein an erase or write operation on said first memory cell block and a read operation on said second memory cell block are simultaneously carried out.

16. An electrically erasable programmable nonvolatile semiconductor memory as claimed in claim 1, wherein said electrically erasable programmable nonvolatile semiconductor memory is a flash-type electrically erasable programmable read only memory.

17. An electrically erasable programmable nonvolatile semiconductor memory as claimed in claim 1, further comprising:

a write/erase tester for discriminating a write or an erase states; and a chip-state tester for discriminating a state of a semiconductor chip.

* * * * *